US006320263B1

(12) United States Patent
Lopatin et al.

(10) Patent No.: US 6,320,263 B1
(45) Date of Patent: *Nov. 20, 2001

(54) SEMICONDUCTOR METALIZATION BARRIER AND MANUFACTURING METHOD THEREFOR

(75) Inventors: Sergey D. Lopatin, Santa Clara, CA (US); John A. Iacoponi, Austin, TX (US)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/252,165

(22) Filed: Feb. 18, 1999

(51) Int. Cl.[7] ............................. H01L 23/48; H01L 23/52
(52) U.S. Cl. ................... 257/758; 257/751; 257/752; 257/753; 257/759; 257/762; 257/773
(58) Field of Search ..................... 257/750–753, 257/758, 761, 762, 763, 765, 766, 768, 769, 771–775, 745, 700, 638

(56) References Cited

U.S. PATENT DOCUMENTS

| 5,045,502 | * | 9/1991 | Lau et al. ............................. 257/745 |
| 5,169,680 | * | 12/1992 | Ting et al. ............................ 438/629 |
| 5,510,651 | * | 4/1996 | Maniar et al. ........................ 257/751 |

FOREIGN PATENT DOCUMENTS 4-14833 * 1/1992 (JP).

* cited by examiner

Primary Examiner—Tom Thomas
Assistant Examiner—Hung Kim Vu
(74) Attorney, Agent, or Firm—Mikio Ishimaru

(57) ABSTRACT

A semiconductor metalization barrier, and manufacturing method therefor, is provided which is deposited from an aqueous solution containing the Period 4 transition metals of chromium, nickel, and copper deposited on a palladium-activated copper bonding pad.

5 Claims, 2 Drawing Sheets

SEMICONDUCTOR METALIZATION BARRIER AND MANUFACTURING METHOD THEREFOR

TECHNICAL FIELD

The present invention relates generally to semiconductors and more specifically barrier materials.

BACKGROUND ART

While manufacturing integrated circuits, after the individual devices, such as the transistors, have been fabricated in the silicon substrate, they must be connected together to perform the desired circuit functions. This connection process is generally called "metalization", and is performed using a number of different photolithographic and deposition techniques.

One metalization process, which is called the "damascene" technique, starts with the placement of a first channel dielectric layer, which is typically an oxide layer, over the semiconductor devices. A first damascene step photoresist is then placed over the oxide layer and is photolithographically processed to form the pattern of the first channels. An anisotropic oxide etch is then used to etch out the channel oxide layer to form the first channel openings. The damascene step photoresist is stripped and a barrier layer is deposited to coat the walls of the first channel opening to ensure good adhesion and to act as a barrier material to prevent diffusion of such conductive material into the oxide layer and the semiconductor devices (the combination of the adhesion and barrier material is collectively referred to as "barrier layer" herein). A seed layer is then deposited on the barrier layer to form a conductive material base, or "seed", for subsequent deposition of conductive material. A conductive material is then deposited in the first channel openings and subjected to a chemical-mechanical polishing process which removes the first conductive material above the first channel oxide layer and damascenes the conductive material in the first channel openings to form the first channels.

For multiple layers of channels, another metalization process, which is called the "dual damascene" technique, is used in which the channels and vias are formed at the same time. In one example, the via formation step of the dual damascene technique starts with the deposition of a thin stop nitride over the first channels and the first channel oxide layer. Subsequently, a separating oxide layer is deposited on the stop nitride. This is followed by deposition of a thin via nitride. Then a via step photoresist is used in a photolithographic process to designate round via areas over the first channels.

A nitride etch is then used to etch out the round via areas in the via nitride. The via step photoresist is then removed, or stripped. A second channel dielectric layer, which is typically an oxide layer, is then deposited over the via nitride and the exposed oxide in the via area of the via nitride. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The damascene photoresist is then removed, and a nitride etch process removes the nitride above the first channels in the via areas. A barrier layer is then deposited to coat the via openings and the second channel openings. Next, a seed layer is deposited on the barrier layer. This is followed by a deposition of the conductive material in the second channel openings and the via openings to form the second channel and the via. A second chemical-mechanical polishing process leaves the two vertically separated, horizontally perpendicular channels connected by a cylindrical via.

The use of the damascene techniques eliminates metal etch and dielectric gap fill steps typically used in the metalization process. The elimination of metal etch steps is important as the semiconductor industry moves from aluminum to other metalization materials, such as copper, which are very difficult to etch.

One drawback of using copper is that copper diffuses rapidly through various materials. Unlike aluminum, copper also diffuses through dielectrics, such as oxide. When copper diffuses through dielectrics, it can cause damage to neighboring devices on the semiconductor substrate. To prevent diffusion, materials such as tantalum nitride (TaN), titanium nitride (TiN), or tungsten nitride (WN) are used as channel barrier materials for copper.

Further, copper is often subject to oxidation so bonding pad areas must be protected after manufacture of the chip and before bonding of the external electrical connections; otherwise, the external electrical connection may be inadequate or may fail.

Even further, with various types of barrier layers, copper is still subject to strong electro-migration, or movement of copper atoms under current, which can lead to voids in the copper bonding pads as copper migrates into the external electrical connection. However, copper has poor surface adhesion characteristics to most of the suitable barrier materials, and thus, it has been difficult to find an answer which would improve resistance to electromigration and have good surface adhesion.

As the semiconductor industry is moving from aluminum to copper and other forms of high conductivity materials in order to obtain higher semiconductor circuit speeds, it is becoming more pressing that answers be found.

DISCLOSURE OF THE INVENTION

The present invention provides a semiconductor metalization barrier for conductive bonding pads and a manufacturing method therefor. The barrier material provides a better barrier for protecting the bonding pads and an improved surface adhesion to the bonding pads.

The present invention further provides a semiconductor metalization barrier for conductive bonding pads selected from the Period 4 transition metals, alloys thereof, and combinations thereof formed atop the high conductivity bonding pad.

The present invention further provides a method of manufacturing semiconductor metalization barrier deposited from an aqueous solution containing the Period 4 transition metals of chromium, nickel, and copper deposited on a Period 5 transition metal, palladium, activated copper bonding pad.

The present invention further provides a method of manufacturing a chromium, nickel, and copper semiconductor metalization barrier on a palladium activated copper bonding pad.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
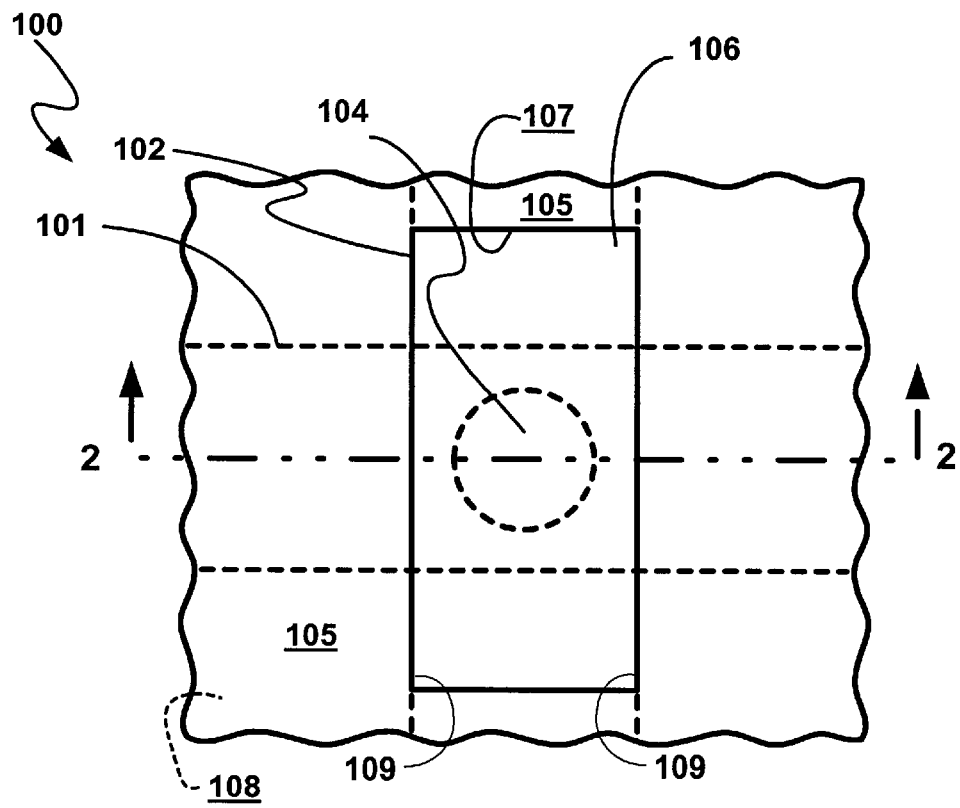
FIG. 1 is a plan view of aligned channels before activation and deposition.

Referring now to FIG. 1, therein is shown a plan view of a pair of perpendicularly aligned semiconductor channels of a conductive material such as aluminum, copper, tungsten or polysilicon disposed over a production semiconductor wafer 100. A first channel 101 is shown disposed below a second channel 102 which extends substantially perpendicular to the first channel 101 in the plan view. Similarly, a round via 104 connects the first and second channels 101 and 102 and is a part of the second channel 102. The first channel 101 contains a first conductive material. The second channel 102 is formed by filling a second channel opening 106 disposed in a second channel oxide layer 108 with a second conductive material. The oxide layers are generally of the dielectric silicon dioxide ($SiO_2$). The second channel opening 106 is defined by walls (sidewalls) 109 of the second channel oxide 108.

Disposed over the second channel oxide 108 is a top layer dielectric 105 which has an opening 107 provided therein for deposition of the metalization barrier as will later be described.

Figure 2:
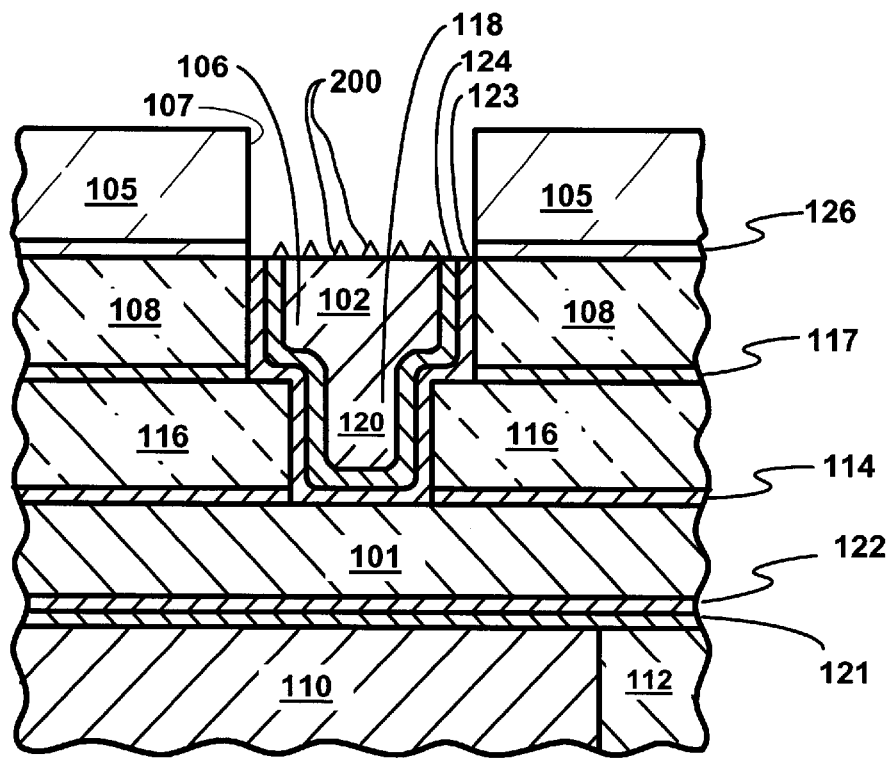
FIG. 2 is a cross-section of FIG. 1 along line 2—2 after activation but before deposition of the bonding pad.

Referring now to FIG. 2, therein is shown a cross-section of FIG. 1 along 2—2. The first channel 101 is disposed over a polysilicon gate 110 and a dielectric 112 of a semiconductor device on an integrated circuit chip (not shown). The first and second channels 101 and 102 are in horizontal planes separated vertically by a stop nitride layer 114, a via oxide layer 116, and a thin via nitride layer 117. The nitride layer is composed of a compound of silicon nitride (SiN). The cross-sectional area of the round via 104 of FIG. 1 defines a cylindrical via 120 when it is filled with the second conductive material.

Also shown disposed around the first channel 101 is a barrier layer 121, a seed layer 122 and around the second channel 102, and the cylindrical via 120 is a barrier layer 123 and a seed layer 124. The barrier layers 121 and 123 include barrier material combinations such as titanium/titanium nitride, tantalum/tantalum nitride, and tungsten nitride for copper and copper alloy seed layer conductive materials.

The top dielectric layer 105 is shown disposed on top of a nitride layer 126. The top dielectric layer 105 and the nitride layer 126 have an opening which exposes the conductive material in the channel 102, and in this opening are deposited small areas of a Period 5 transition metal 200, such as palladium. The surface is palladium-activated, which means the palladium nucleates on the surface during substrate immersion in a solution containing palladium chloride, hydrofluoric acid, and hydrochloric acid.

Figure 3:
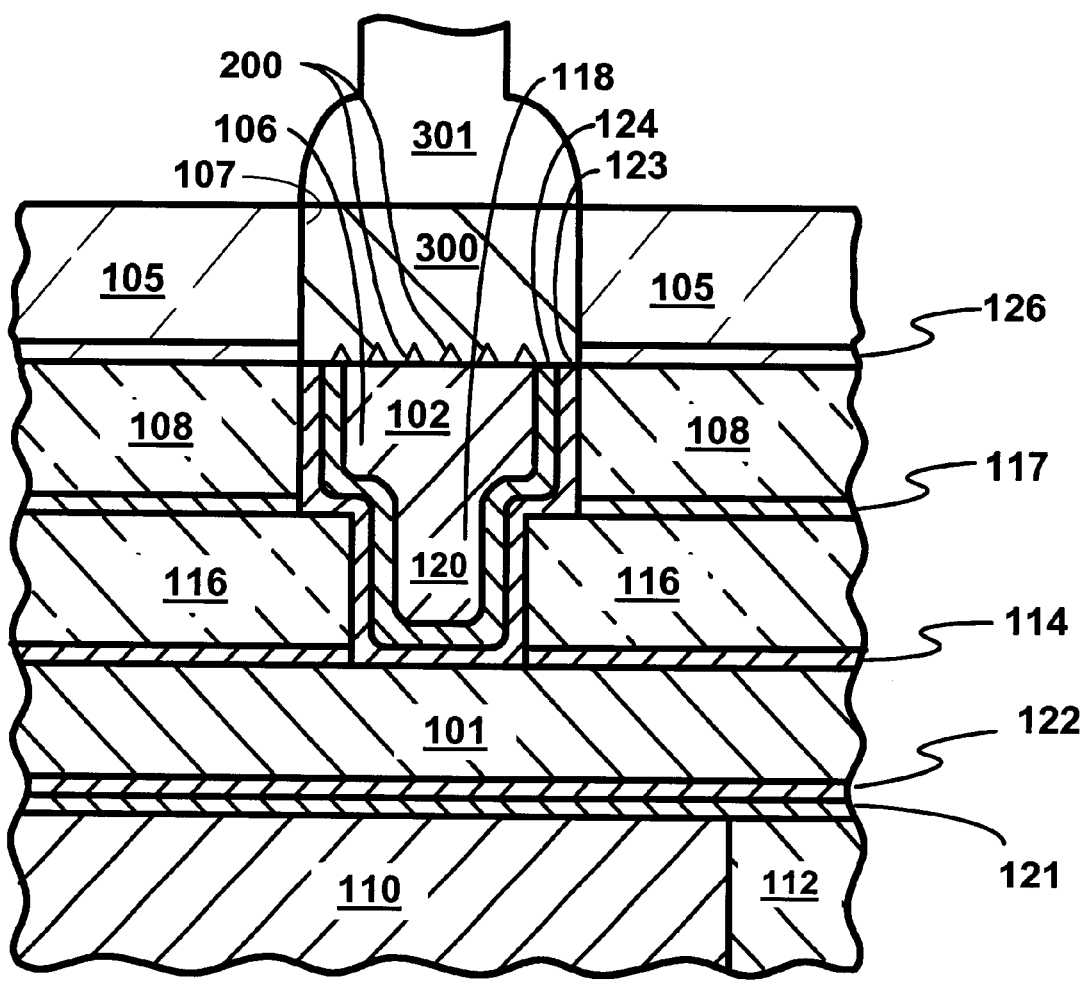
FIG. 3 is a cross-section of a FIG. 2 after activation and deposition of the bonding pad in accordance with the present invention.

Referring now to FIG. 3, therein is shown the Period 4 transition metals 300 deposited over the Period 5 transition metal 200. In the preferred embodiment, the Period 4 transition metals are a combination of chromium-nickel-copper which are deposited on the palladium, as will later be described. A nitride layer 126 would then be deposited over the second channel oxide layer 108 and the second conductive metal in the second channel 102. This would be followed by the deposition of a top dielectric layer 105.

Again, by using a photoresist and a photolithographic process followed by etching, the pattern of bonding pad areas would be exposed, such as the opening 107. At this point, the Period 5 transition metal 200, palladium, would be deposited by palladium-activation, as previously described.

After the Period 5 transition metal activation, the Period 4 transition metal 300 would be deposited. In the preferred embodiment, the selective chromium-nickel-copper alloy can be deposited using an aqueous solution containing chromium, nickel, and copper salts with the addition of reducing and complexing agents. The chromium-nickel-copper alloy can be deposited selectively on the conductive material, copper, in the second channel 102 and the seed layer 124, using the palladium activation of the copper surface or a heating solution for chromium-nickel-copper deposition.

The composition of the chromium-nickel-copper alloy will be adjusted to develop good barrier properties against copper diffusion and developing good bonding to the top layer of the copper metalization. It is understood by those skilled in the art that copper is subject to strong electromigration, or movement of copper atoms, under current flow which can lead to voids in the copper channel. Additional problems arise when the external electrical connection 301 is made using aluminum wires. Inner diffusion, or electromigration of copper and aluminum, leads to formation of high-resistance compounds which may additionally cause integrated circuits to fail.

In production, a conventional first damascene process is used to put down the first channel 101 in a first channel oxide layer (not shown) above portions of a semiconductor device (not shown). The damascene process is a photolithographic process which uses a mask to define a first channel opening (not shown) in the first channel oxide layer. The first channel opening is then filled with the thin barrier layer 121, the thin seed layer 122, and the first conductive material, such as copper, to form the first channel 101 using conventional metal deposition techniques, such as physical vapor deposition, chemical vapor deposition, electroplating, or a combination thereof The top surface would then be subject to chemical-mechanical polishing (CMP) to bring it level with the first channel oxide layer.

For the second channel 102, the stop nitride layer 114, the via oxide layer 116, and the via nitride layer 117 would be successively deposited on top of the first conductive metal in the first channel 101 and the first channel oxide layer using conventional deposition techniques.

By using the via photoresist and the via photolithographic process followed by nitride etching of a round via opening 104 in the via nitride layer 117, the basis for the cylindrical via 118 was formed. The subsequent deposition of the second channel oxide layer 108 prepared the way for the second channel 102 to be perpendicular to the first channel 101.

The second damascene process is a photolithographic process which uses a mask to define the second channel opening 106 in the second channel oxide layer 108. Since the second damascene process uses an anisotropic oxide etch, the etch also forms the cylindrical via opening 118 down to the stop nitride layer 114. The anisotropic oxide etch etches faster in the vertical direction of FIG. 2 than in the horizontal direction. The nitride etch of the stop nitride layer 114 exposes a portion of the first conductive material in the first channel 101 and completes the etching step. The second channel opening 106 is then filled with the thin barrier layer 123, the thin seed layer 124, and the second conductive material. The second conductive material is also a conductor, such as copper, to form the second channel 102 using conventional metal deposition techniques, such as physical vapor deposition, chemical vapor deposition, electroplating, or a combination thereof A CMP process is used to level the second channel 102.

While the best mode utilizes aluminum and copper as the conductive materials, it should be understood that the present invention is applicable to conductive materials such as copper, aluminum, doped polysilicon, gold, silver, compounds thereof, alloys thereof, and combinations thereof.

Further, although the embodiments of the present invention are primarily directed to using the dual damascene technique, it also will be recognized by those skilled in the art that other techniques of forming interconnect, such as the single damascene technique, or other traditional techniques of forming low resistance contacts or plugs which involve filling an opening with conductive materials such as tungsten or aluminum may be used to practice the present invention.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A semiconductor device comprising:
   a semiconductor substrate;
   a first dielectric layer on said semiconductor substrate, said first dielectric layer having an opening provided therein;
   a first conductive layer disposed in said opening in said first dielectric layer;
   a second dielectric layer disposed on said first dielectric layer and said first conductive layer, said second dielectric layer having a second opening provided therein exposing a portion of said first conductive layer;
   a Period 5 transition metal disposed in said second opening whereby said first conductive layer is activated by the Period 5 transition metal; and
   a plurality of Period 4 transition metals in alloy selectively disposed on said Period 5 transition metal to form a barrier layer thereon an exterior electrical connection the Period 4 transition metals, wherein the external electrical connection uses a material selected from a group consisting of copper, aluminum, gold, silver, an alloy thereof, and a combination thereof.

2. The semiconductor device as claimed in claim 1 wherein said Period 5 transition metal is palladium.

3. The semiconductor device as claimed in claim 1 wherein said Period 4 transition metal is selected from a group consisting of chromium, nickel, copper, an alloy thereof, and a combination thereof.

4. The semiconductor device as claimed in claim 1 wherein said Period 4 transition metals are chromium, nickel, and copper.

5. The semiconductor device as claimed in claim 1 wherein said first conductive layer is selected from a group consisting of copper, aluminum, gold, silver, and alloy thereof, and a combination thereof.

* * * * *